(12) United States Patent
Srinivasan et al.

(10) Patent No.: US 10,151,797 B2
(45) Date of Patent: Dec. 11, 2018

(54) LOGIC BUILT-IN SELF-TEST (LBIST) WITH PIPELINE SCAN ENABLE LAUNCH ON SHIFT (LOS) FLIP-FLOP CIRCUIT

(71) Applicant: STMicroelectronics International N.V., Amsterdam (NL)

(72) Inventors: Venkata Narayanan Srinivasan, Gautam Budh Nagar District (IN); Tripti Gupta, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 94 days.

(21) Appl. No.: 15/223,061

(22) Filed: Jul. 29, 2016

(65) Prior Publication Data
US 2018/0031631 A1 Feb. 1, 2018

(51) Int. Cl.
*G01R 31/3185* (2006.01)

(52) U.S. Cl.
CPC ......... *G01R 31/318544* (2013.01); *G01R 31/318541* (2013.01); *G01R 31/318536* (2013.01); *G01R 31/318572* (2013.01)

(58) Field of Classification Search
None
See application file for complete search history.

(56) References Cited

U.S. PATENT DOCUMENTS

| | | | |
|---|---|---|---|
| 8,578,226 B2 | 11/2013 | Chung | |
| 8,635,503 B2* | 1/2014 | Tang | G01R 31/318594 714/726 |
| 9,297,855 B1* | 3/2016 | Jindal | G01R 31/3177 |
| 2009/0259898 A1* | 10/2009 | Wen | G01R 31/3183 714/726 |
| 2014/0101501 A1* | 4/2014 | Devta Prasanna | G01R 31/318544 714/727 |
| 2015/0067423 A1* | 3/2015 | GopalaKrishnaSetty | G01R 31/318544 714/726 |
| 2016/0091563 A1* | 3/2016 | Lu | G01R 31/318541 714/727 |

* cited by examiner

*Primary Examiner* — Steve N Nguyen
(74) *Attorney, Agent, or Firm* — Crowe & Dunlevy

(57) ABSTRACT

A logic built-in self-test (LBIST) circuit implements a pipeline scan enable launch on shift (LOS) feature. A first scan chain flip-flop has a scan enable input configured to receive a first scan enable signal. A logic circuit has a first input coupled to a data output of the first scan chain flip-flop and a second input coupled to receive the first scan enable signal. A second scan chain flip-flop has a scan input coupled to a scan output of the first scan chain flip-flop. A scan enable input of the second scan chain flip-flop is coupled to receive a second scan enable signal generated at an output of the logic circuit. The first and second scan chain flip-flops are clocked by a same clock signal.

16 Claims, 6 Drawing Sheets

LOGIC BUILT-IN SELF-TEST (LBIST) WITH PIPELINE SCAN ENABLE LAUNCH ON SHIFT (LOS) FLIP-FLOP CIRCUIT

TECHNICAL FIELD

The present invention relates to test circuitry for integrated circuit devices and, in particular, to test circuitry used to test for a stuck-at fault condition with at-speed patterns in a logic built-in self-test (LBIST) partition. The test circuitry is further operable in connection with transition fault (or at-speed fault) condition testing with at-speed patterns.

BACKGROUND

Automated testing systems for integrated circuit devices are well known to those skilled in the art. Such systems may be used to test for a number of different types of faults. One common fault of interest for testing is the so called "stuck-at" fault in which the output of a logic circuit is persistently stuck in a certain logic state regardless of change in input. It is also important to be able to test for faults in response to tests conducted at system speeds (referred to in the art at "at-speed" fault detection). Stuck-at and at-speed testing is commonly performed with the use of automated test equipment (ATE).

Logic built-in self-test (LBIST) technology is well known in the art for testing the operation of integrated circuits. One advantage of LBIST is that the integrated circuit is functioning to test itself. This is especially important in connection with integrated circuits used in safety applications. Integrated circuits designed for military, medical and automotive implementations, for example, are common users of LBIST technology. LBIST is typically provided for testing random logic within the integrated circuit. A pseudo-random pattern generator (PRPG) operates to generate input test patterns that are applied to an internal scan chain. A multiple input signature register (MISR) collects the response of the device to the input test patterns. In the event the MISR output differs from an anticipated output (often referred to as the test "signature"), this indicates presence of a defect. The integrated circuit may, in response to such a defect, operate in a reduced function mode and signal an error. If the test is passed, the integrated circuit then automatically transitions into the functional mode of operation.

A common example of this for the automotive industry would apply to the integrated circuit for an electronically controlled braking system. The LBIST would be actuated each time the vehicle is turned on, and further perhaps on a periodic basis during operation, to test the logic functionality for stuck-at and at-speed faults. If the testing is passed, the electronically controlled braking system is configured for full operation. However, if the testing is not passed, a warning signal for brake system failure is passed to the driver.

It has proven difficult to meet customer coverage requirements with the use of pseudo-random patterns for testing. It is also noted that increasing the LBIST pattern count will result in a delay with respect to the integrated circuit passing into the function mode of operation. There is accordingly a need in the art to address the foregoing problems while supporting an LBIST solution for integrated circuit testing.

SUMMARY

In an embodiment, a circuit comprises: a first flip-flop having a data input, a scan input, a data output and a scan output, said first flip-flop clocked by a clock signal and having a scan enable input configured to receive a first scan enable signal; a logic circuit having a first input coupled to the data output of the first flip-flop and a second input coupled to receive the first scan enable signal; and a second flip-flop having a data input, a scan input, a data output and a scan output, said scan input of the second flip-flop coupled to the scan output of the first flop-flop, said second flip-flop clocked by the clock signal and having a scan enable input configured to receive a second scan enable signal generated at an output of the logic circuit.

In an embodiment, a circuit comprises: a test control circuit configured to output a first clock signal, a second clock signal, a first scan enable signal, a first test data signal and a second test data signal; a first scan chain circuit and a second scan chain circuit. The first scan chain circuit comprises: a first flip-flop having a data input, a scan input, a data output and a scan output, said first flip-flop clocked by the first clock signal and having a scan enable input configured to receive the first scan enable signal; a first logic circuit having a first input coupled to the data output of the first flip-flop and a second input coupled to receive the first scan enable signal; and a second flip-flop having a data input, a scan input, a data output and a scan output, said scan input of the second flip-flop coupled to the scan output of the first flop-flop, said second flip-flop clocked by the first clock signal and having a scan enable input configured to receive a second scan enable signal generated at an output of the first logic circuit. The second scan chain circuit comprises: a third flip-flop having a data input, a scan input, a data output and a scan output, said third flip-flop clocked by the second clock signal and having a scan enable input configured to receive the first scan enable signal; a second logic circuit having a first input coupled to the data output of the third flip-flop and a second input coupled to receive the first scan enable signal; and a fourth flip-flop having a data input, a scan input, a data output and a scan output, said scan input of the fourth flip-flop coupled to the scan output of the third flop-flop, said fourth flip-flop clocked by the second clock signal and having a scan enable input configured to receive a third scan enable signal generated at an output of the second logic circuit.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
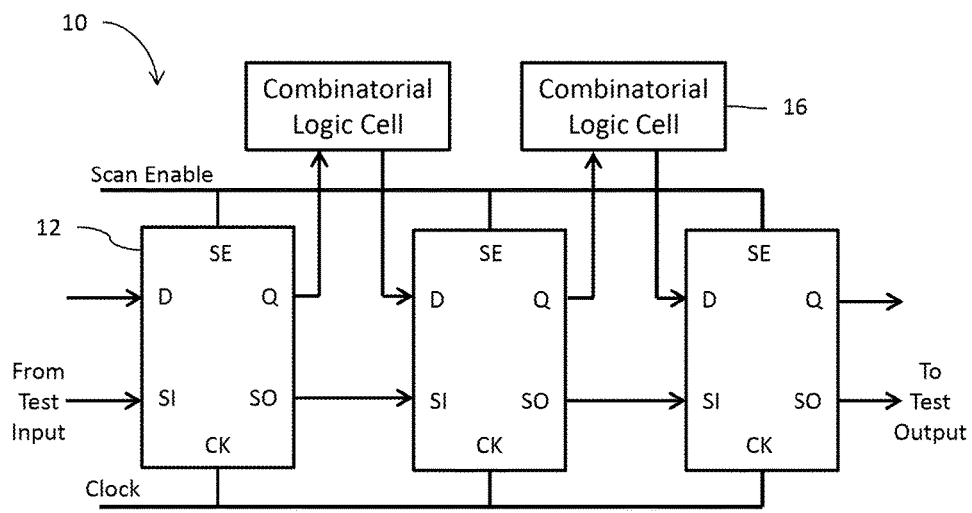
FIG. 1 is a block diagram of a scan chain.

Reference is now made to FIG. 1 showing a block diagram of a scan chain 10 formed by a plurality of scan chain cells, wherein each cell comprises a flip-flop 12. Each flip-flop 12 includes a data input (D), a scan input (SI), a data output (Q) and a scan output (SO). Each flip-flop 12 in the scan chain 10 is further configured to receive a same clock signal at a clock input (CK). The mode of operation of each flip-flop 12 in the scan chain 10 is controlled by a scan enable signal applied to the flip-flop scan enable (SE) input. When scan enable is in a first logic state, designating the shift mode of operation, the flip-flop 12 responds to the clock signal by shifting the data received at the scan input (SI) to the data output (Q) and scan output (SO). When scan enable is in a second logic state, designating the capture mode of operation, the flip-flop 12 responds to the clock signal by shifting the data received at the data input (D) to the data output (Q) and scan output (SO).

In the scan chain 10, the scan output (SO) of one flip-flop 12 is coupled to the scan input (SI) of the next successive flip-flop 12 in the scan chain (i.e., is coupled to the next cell in the series of cells making up the scan chain). The scan input (SI) of the first flip-flop 12 in the scan chain 10 is coupled to receive the input test data from a test input. The scan output (SO) of the last flip-flop 12 in the scan chain 10 is coupled to output test result data to a test output. The data output (Q) of one flip-flop 12 is coupled to an input of a combinatorial logic cell 16 that is being tested. The combinatorial logic cell 16 includes a number of interconnected logic circuits designed to perform one or more functional operations. An output of the combinatorial logic cell 16 is coupled to the data input (D) of the next successive flip-flop 12 in the scan chain 10 (i.e., is coupled to the next cell in the series of cells making up the scan chain). The data input (D) of the first flip-flop 12 in the scan chain 10 may be configured to receive a signal from another hardware function on the chip (such as a combinatorial logic cell 16) or a chip-level input pad. The data output (Q) of the last flip-flop 12 in the scan chain 10 is typically used to either drive the input of another hardware function on the chip (such as a combinatorial logic cell 16) or a chip-level output pad.

Figure 2:
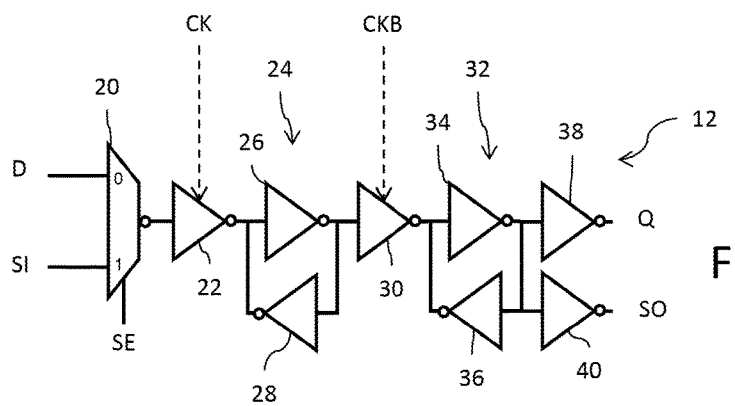
FIG. 2 is a circuit design for an example scan chain flip-flop.

The flip-flop 12 may have any suitable circuit design. FIG. 2 shows the circuit design for one non-limiting example of the flip-flop 12. The flip-flop 12 includes a multiplexer 20 having inputs coupled to the data input (D) and the scan input (SI). The multiplexer 20 selects one of those inputs for inverted output in response to the logic state of the scan enable (Scan-En) signal. A clocked inverter 22 has an input coupled to the output of the multiplexer 20. The clocked inverter 22 is controlled by the clock signal (CK). A first latch 24 is formed by cross-coupled inverters 26 and 28 and has an input coupled to the output of the clocked inverter 22. A clocked inverter 30 has an input coupled to the output of the first latch 24. The clocked inverter 30 is controlled by the logical inverse of the clock signal (CKB). A second latch 32 is formed by cross-coupled inverters 34 and 36 and has an input coupled to the output of the clocked inverter 30. A first output inverter 38 has an input coupled to the output of the second latch 32 and provides the data output (Q). A second output inverter 40 has an input coupled to the output of the second latch 32 and provides the scan output (SO).

Figure 3:
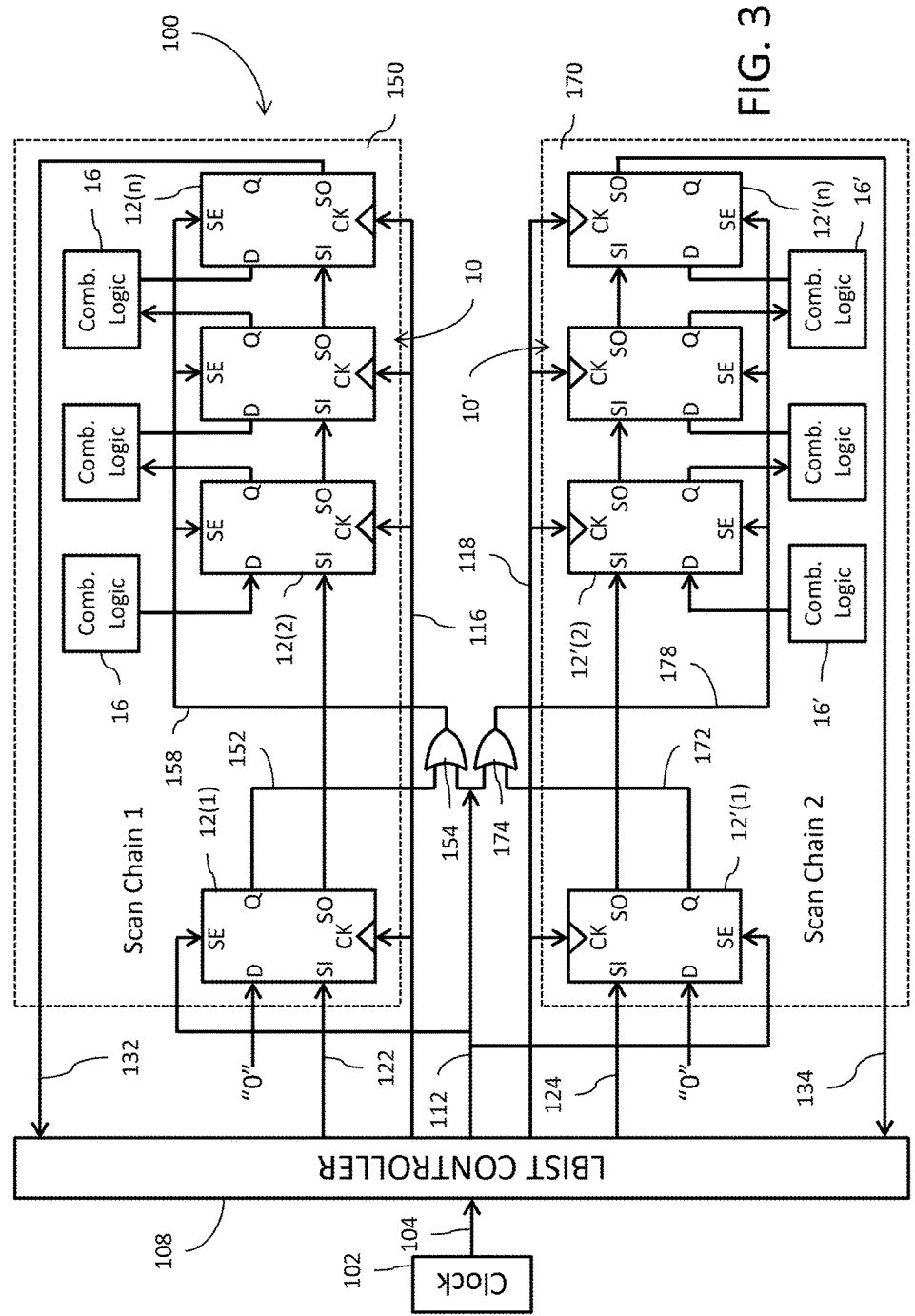
FIG. 3 is a block diagram of a testing circuit.

Reference is now made to FIG. 3 showing a block diagram of a testing circuit 100. The testing circuit 100 includes a clock source 102 generating a logic built-in self-test (LBIST) clock signal (LBIST_clk) 104 that is received by an LBIST controller 108. The LBIST controller 108 generates an LBIST scan enable signal (LBIST_se) 112, first and second LBIST control clock signals (LBIST_ctl_clk1 and LBIST_ctl_clk2) 116 and 118, respectively, and first and second LBIST scan input data signals (LBIST_si1 and LBIST_si2) 122 and 124, respectively. The LBIST controller 108 further receives first and second LBIST scan output data signals (LBIST_so1 and LBIST_so2) 132 and 134, respectively. The LBIST controller 108 functions to generate the clock signals and test data for testing circuitry of an integrated circuit and processing the test output data to determine whether a stuck-at fault and/or at-speed fault exists.

The LBIST scan enable signal (LBIST_se) 112, first LBIST control clock signal (LBIST_ctl_clk1) 116 and first LBIST scan input data signal (LBIST_si1) 122 are applied by the LBIST controller 108 as inputs to a first scan chain 150. The first LBIST scan output data signal (LBIST_so1) 132 is received by LBIST controller 108 as an input from an output of the first scan chain 150.

The first scan chain 150 comprises a plurality of scan chain cells, wherein each cell comprises a flip-flop 12. Each flip-flop 12 includes a data input (D), a scan input (SI), a data output (Q) and a scan output (SO) and may be constructed, for example, with a circuit configuration as shown in FIG. 2.

A flip-flop 12(1) in the scan chain 150 is configured as a pipeline scan enable launch on shift (LOS) flip-flop. The flip-flop 12(1) is configured to receive the first LBIST control clock signal (LBIST_ctl_clk1) 116 at its clock input (CK). The data input (D) of the flip-flop 12(1) is configured to receive a fixed logic state data signal (in this case a logic low "0" signal). The scan input (SI) of the flip-flop 12(1) is coupled to receive the first LBIST scan input data signal (LBIST_si1) 122 from the LBIST controller 108.

The mode of operation of the flip-flop 12(1) in the scan chain 150 is controlled by the LBIST scan enable signal (LBIST_se) 112 applied to the scan enable (SE) input of the flip-flop 12(1) by the LBIST controller 108. When the LBIST scan enable signal (LBIST_se) 112 is in a first logic state, designating the shift mode of operation, the flip-flop 12(1) responds to the first LBIST control clock signal (LBIST_ctl_clk1) 116 by shifting the test data of the first LBIST scan input data signal (LBIST_si1) 122 received at the scan input (SI) from the LBIST controller 108 to the data output (Q) and scan output (SO). When the LBIST scan enable signal (LBIST_se) 112 is in a second logic state, designating the capture mode of operation, the flip-flop 12(1) responds to the first LBIST control clock signal (LBIST_ctl_clk1) 116 by shifting the fixed logic state data received at the data input (D) to the data output (Q) and scan output (SO).

The data output (Q) of the flip-flop 12(1) in the scan chain 150 produces a first LOS scan enable clock signal (LOS_se_clk1) 152 that is coupled to a first input of a first logic "OR" gate 154. The second input of the first logic "OR" gate 154 receives the LBIST scan enable signal (LBIST_se) 112. The output of the first logic "OR" gate 154 produces a first scan enable clock signal (se_clk1) 158.

The remaining flip-flops 12(2)-12(n) of the first scan chain 150 are arranged in a manner like the scan chain 10 of FIG. 1. Each of the flip-flops 12(2)-12(n) is configured to receive the first LBIST control clock signal (LBIST_ctl_clk1) 116 at its clock input (CK). The data output (Q) of one flip-flop 12 is coupled to an input of a combinatorial logic cell 16 that is being tested. The combinatorial logic cell 16 includes a number of interconnected logic circuits designed to perform one or more functional operations. An output of the combinatorial logic cell 16 is coupled to the data input (D) of the next successive flip-flop 12 in the scan chain (i.e., is coupled to the next cell in the series of cells making up the scan chain). The data input (D) of the flip-flop 12(2) may be configured to receive a signal from a combinatorial logic cell 16. The scan input (SI) of the flip-flop 12(2) is coupled to the scan output (SO) of the flip-flop 12(1) in the scan chain 150. The scan output (SO) of one flip-flop 12 is coupled to the scan input (SI) of the next successive flip-flop 12 in the scan chain (i.e., is coupled to the next cell in the series of cells making up the scan chain). The scan output (SO) of the last flip-flop 12(n) in the first scan chain 150 produces the first LBIST scan output data signal (LBIST_so1) 132 that is coupled to the LBIST controller 108.

The mode of operation of the flip-flops 12(2)-12(n) in the first scan chain 150 is controlled by the first scan enable clock signal (se_clk1) 158 generated by the first logic "OR" gate 154 and applied to the scan enable (SE) input of each of the flip-flops 12(2)-12(n). When the first scan enable clock signal (se_clk1) 158 is in a first logic state, designating the shift mode of operation, the flip-flops 12(2)-12(n) respond to the first LBIST control clock signal (LBIST_ctl_clk1) 116 by shifting the data received from the pipeline scan enable launch on shift (LOS) flip-flop 12(1) at the scan input (SI) to the data output (Q) and scan output (SO). When the first scan enable clock signal (se_clk1) 158 is in a second logic state, designating the capture mode of operation, the flip-flops 12(2)-12(n) respond to the first LBIST control clock signal (LBIST_ctl_clk1) 116 by shifting the data received at the data input (D) from the combinational logic 16 to the data output (Q) and scan output (SO).

Figure 4:
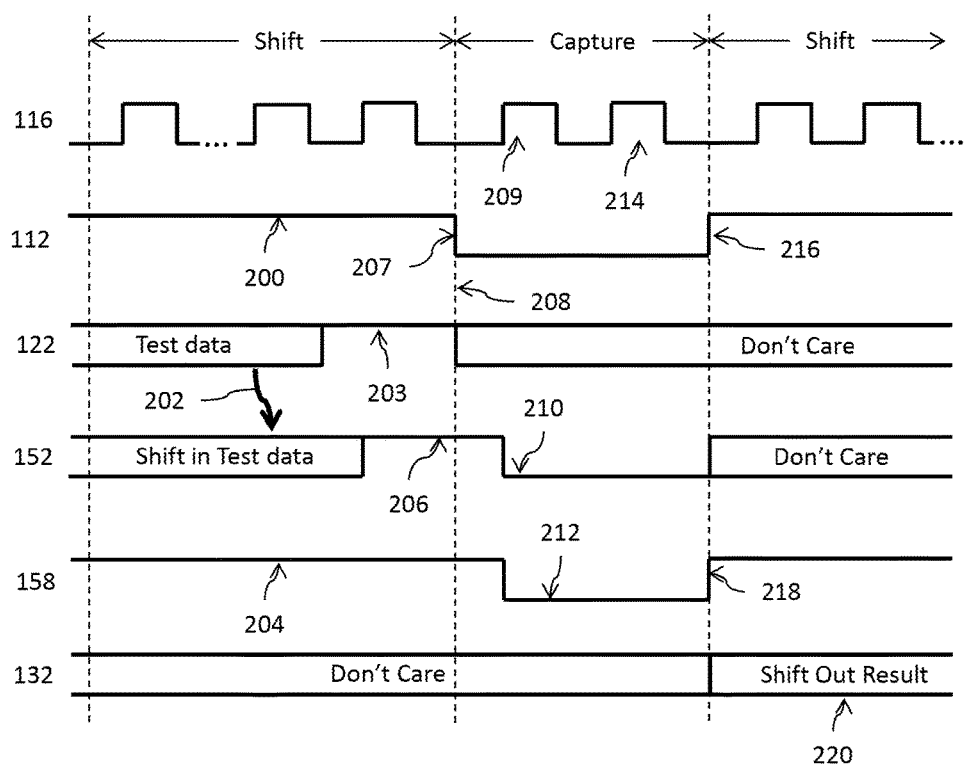
FIGS. 4, 5, 6A and 6B are timing diagrams showing operation of the testing circuit of FIG. 3.

With reference to FIG. 4, operation of the first scan chain 150 to support a pipeline scan enable LOS feature is as follows:
- when the LBIST scan enable signal (LBIST_se) 112 is in the first logic state (i.e., logic high "1") designating the shift mode of operation (reference 200), the test data output by the LBIST controller 108 in the first LBIST scan input data signal (LBIST_si1) 122 are received at the scan input (SI) of the flip-flop 12(1) and passed (reference 202) with each pulse of the first LBIST control clock signal (LBIST_ctl_clk1) 116 to the data output (Q) and scan output (SO) for flip-flop 12(1);
- it is important for the last shift value of the test data in the first LBIST scan input data signal (LBIST_si1) 122 to be logic high "1" (reference 203) in order to support implementation of the pipeline scan enable LOS feature as discussed below;
- because the LBIST scan enable signal (LBIST_se) 112 is in the first logic state (i.e., logic high "1"), the first scan enable clock signal (se_clk1) 158 at the output of the logic "OR" gate 154 is also logic high (reference 204) and the flip-flops 12(2)-12(n) are thus also configured in the shift mode of operation;
- the test data output by the LBIST controller 108 in the first LBIST scan input data signal (LBIST_si1) 122 and passed through the flip-flop 12(1) will thus also be shifted into the flip-flops 12(2)-12(n) with each pulse of the first LBIST control clock signal (LBIST_ctl_clk1) 116, except for the last shift value of the test data in the first LBIST scan input data signal (LBIST_si1) 122 which is stored (reference 206) by the first flip-flop 12(1) at the end of the shift mode time period;
- the LBIST controller 108 then causes the LBIST scan enable signal (LBIST_se) 112 to transition (reference 207) from the first logic state (i.e., logic high "1") to the second logic state (i.e., logic low "0") designating the capture mode of operation for the flip-flop 12(1);
- at this moment in time (reference 208), it will be noted that the LBIST scan enable signal (LBIST_se) 112 is logic low "0" and the data output (Q) and scan output (SO) of the flip-flop 12(1) are both logic high "1" because the last shift value 206 of the test data is logic high "1", so that: a) the first LOS scan enable clock signal (LOS_se_clk1) 152 and first scan enable clock signal (se_clk1) 158 are both logic high "1"; and b) the flip-flops 12(2)-12(n) remain configured in shift mode while the flip-flop 12(1) is configured in capture mode so as to support the pipeline scan enable LOS feature;
- with the next pulse (reference 209) of the first LBIST control clock signal (LBIST_ctl_clk1) 116 generated by the LBIST controller 108, referred to here as the first capture clock pulse, the last shift value of the test data is shifted to flip-flop 12(2) and the logic low "0" value at the data input (D) of the flip-flip 12(1) is passed through the flip-flop 12(1) to the data output (Q) and scan output (SO) to drive the first LOS scan enable clock signal (LOS_se_clk1) 152 to logic low "0" (reference 210);
- the shifted in test data are applied to the combinatorial logic 16;
- with both the LBIST scan enable signal (LBIST_se) 112 and first LOS scan enable clock signal (LOS_se_clk1) 152 now at logic low "0", the first scan enable clock signal (se_clk1) 158 at the output of the first logic "OR" gate 154 is also logic low "0" (reference 212) and the flip-flops 12(2)-12(n) are thus also configured in the capture mode of operation;
- at the next pulse (reference 214) of the first LBIST control clock signal (LBIST_ctl_clk1) 116 generated by the LBIST controller 108, referred to here as the second capture clock pulse, the flip-flops 12(2)-12(n) capture the test result data output from the combinatorial logic 16;
- the LBIST controller 108 then causes the LBIST scan enable signal (LBIST_se) 112 to transition (reference 216) back to the first logic state (i.e., logic high "1") specifying the shift mode of operation for the flip-flop 12(1) of the first scan chain 150;
- the output of the logic "OR" gate 154 thus also transitions to logic high "1" (reference 218) and the flip-flops 12(2)-12(n) of the first scan chain 150 are now also configured in the shift mode of operation; and
- with each pulse of the first LBIST control clock signal (LBIST_ctl_clk1) 116, the captured test data is shifted out (reference 220) from the first scan chain 150 and provided to the LBIST controller 108 using the first LBIST scan output data signal (LBIST_so1) 132.

The LBIST scan enable signal (LBIST_se) 112, second LBIST control clock signal (LBIST_ctl_clk2) 118 and second LBIST scan input data signal (LBIST_si2) 124 are applied by the LBIST controller 108 as inputs to a second scan chain 170. The second LBIST scan output data signal (LBIST_so2) 134 is received by LBIST controller 108 as an input from an output of the second scan chain 170.

The second scan chain 170 comprises a plurality of scan chain cells, wherein each cell comprises a flip-flop 12'. Each flip-flop 12' includes a data input (D), a scan input (SI), a data output (Q) and a scan output (SO) and may be constructed, for example, with a circuit configuration as shown in FIG. 2.

A flip-flop 12'(1) in the second scan chain 170 is configured as a pipeline scan enable launch on shift (LOS) flip-flop. The flip-flop 12'(1) is configured to receive the second LBIST control clock signal (LBIST_ctl_clk2) 118 at its clock input (CK). The data input (D) of the flip-flop 12'(1) is configured to receive a fixed logic state data signal (in this case a logic low "0" signal). The scan input (SI) of the flip-flop 12'(1) is coupled to receive the second LBIST scan input data signal (LBIST_si2) 124 from the LBIST controller 108.

The mode of operation of the flip-flop 12'(1) in the second scan chain 170 is controlled by the LBIST scan enable signal (LBIST_se) 112 applied to the scan enable (SE) input of the flip-flop 12'(1) by the LBIST controller 108. When the LBIST scan enable signal (LBIST_se) 112 is in a first logic state, designating the shift mode of operation, the flip-flop 12'(1) responds to the second LBIST control clock signal (LBIST_ctl_clk2) 118 by shifting the test data of the second LBIST scan input data signal (LBIST_si2) 124 received at the scan input (SI) from the LBIST controller 108 to the data output (Q) and scan output (SO). When the LBIST scan enable signal (LBIST_se) 112 is in a second logic state, designating the capture mode of operation, the flip-flop 12'(1) responds to the second LBIST control clock signal (LBIST_ctl_clk2) 118 by shifting the fixed logic state data received at the data input (D) to the data output (Q) and scan output (SO).

The data output (Q) of the flip-flop 12'(1) in the second scan chain 170 produces a second LOS scan enable clock signal (LOS_se_clk2) 172 that is coupled to a first input of a second logic "OR" gate 174. The second input of the second logic "OR" gate 174 receives the LBIST scan enable signal (LBIST_se) 112. The output of the second logic "OR" gate 174 produces a second scan enable clock signal (se_clk2) 178.

The remaining flip-flops 12'(2)-12'(n) of the second scan chain 170 are arranged as a scan chain 10' in a manner like the scan chain 10 of FIG. 1. Each of the flip-flops 12'(2)-12'(n) is configured to receive the second LBIST control clock signal (LBIST_ctl_clk2) 118 at its clock input (CK). The data output (Q) of one flip-flop 12' is coupled to an input of a combinatorial logic cell 16' that is being tested. The combinatorial logic cell 16' includes a number of interconnected logic circuits designed to perform one or more functional operations. An output of the combinatorial logic cell 16' is coupled to the data input (D) of the next successive flip-flop 12' in the scan chain (i.e., is coupled to the next cell in the series of cells making up the scan chain). The data input (D) of the flip-flop 12'(2) may be configured to receive a signal from a combinatorial logic cell 16'. The scan input (SI) of the flip-flop 12'(2) is coupled to the scan output (SO) of the flip-flop 12'(1) in the second scan chain 170. The scan output (SO) of one flip-flop 12' is coupled to the scan input (SI) of the next successive flip-flop 12' in the scan chain (i.e., is coupled to the next cell in the series of cells making up the scan chain). The scan output (SO) of the last flip-flop 12'(n) in the second scan chain 170 produces the second LBIST scan output data signal (LBIST_so2) 134 that is coupled to the LBIST controller 108.

The mode of operation of the flip-flops 12'(2)-12'(n) in second scan chain 170 is controlled by the second scan enable clock signal (se_clk2) 178 generated by the second logic "OR" gate 174 and applied to the scan enable (SE) input of each of the flip-flops 12'(2)-12'(n). When the second scan enable clock signal (se_clk2) 178 is in a first logic state, designating the shift mode of operation, the flip-flops 12'(2)-12'(n) respond to the second LBIST control clock signal (LBIST_ctl_clk2) 118 by shifting the data received from the pipeline scan enable launch on shift (LOS) flip-flop 12'(1) at the scan input (SI) to the data output (Q) and scan output (SO). When the second scan enable clock signal (se_clk2) 178 is in a second logic state, designating the capture mode of operation, the flip-flops 12'(2)-12'(n) respond to the second LBIST control clock signal (LBIST_ctl_clk2) 118 by shifting the data received at the data input (D) from the combinatorial logic 16' to the data output (Q) and scan output (SO).

Figure 5:
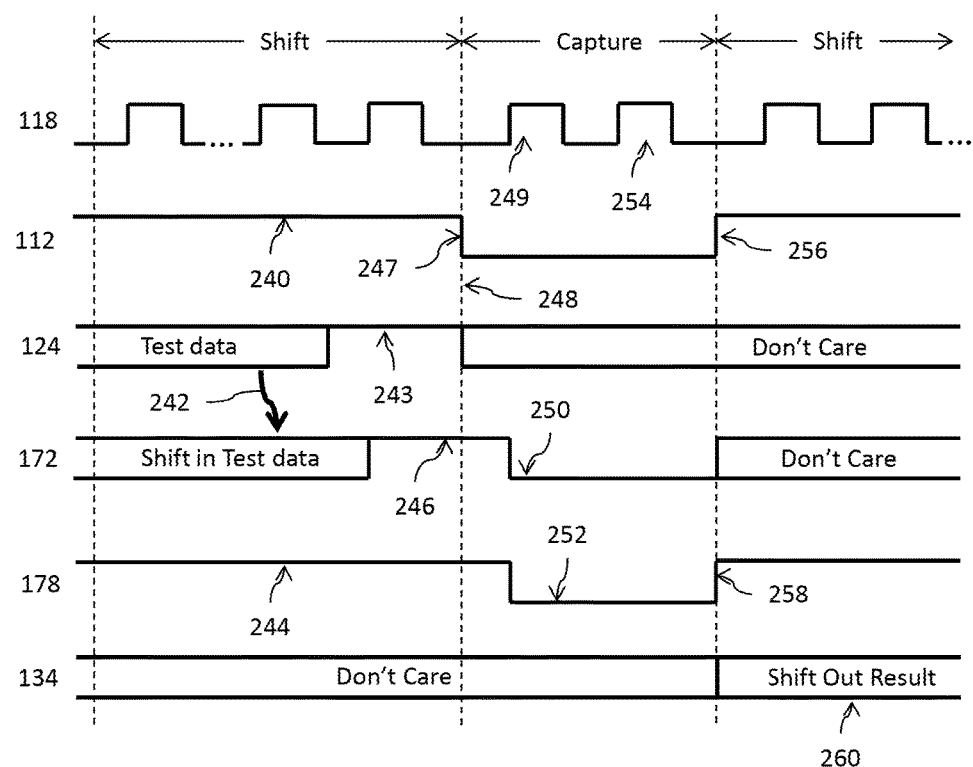

With reference to FIG. 5, operation of the second scan chain 170 to support a pipeline scan enable LOS feature is as follows:

- when the LBIST scan enable signal (LBIST_se) 112 is in the first logic state (i.e., logic high "1") specifying the shift mode of operation (reference 240), the test data output by the LBIST controller 108 in the second LBIST scan input data signal (LBIST_si2) 124 are received at the scan input (SI) of the flip-flop 12'(1) and passed (reference 242) with each pulse of the second LBIST control clock signal (LBIST_ctl_clk2) 118 to the data output (Q) and scan output (SO) for flip-flop 12'(1);
- it is important for the last shift value of the test data in the second LBIST scan input data signal (LBIST_si2) 124 to be logic high "1" (reference 243) in order to support implementation of the pipeline scan enable LOS feature as discussed below;
- because the LBIST scan enable signal (LBIST_se) 112 is in the first logic state (i.e., logic high "1"), the second scan enable clock signal (se_clk2) 178 at the output of the second logic "OR" gate 174 is also logic high (reference 244) and the flip-flops 12'(2)-12'(n) are thus also configured in the shift mode of operation;
- the test data output by the LBIST controller 108 in the second LBIST scan input data signal (LBIST_si2) 124 and passed through the flip-flop 12'(1) will thus also be shifted into the flip-flops 12'(2)-12'(n) with each pulse of the second LBIST control clock signal (LBIST_ctl_clk2) 118, except for the last shift value of the test data in the second LBIST scan input data signal (LBIST_si2) 124 which is stored (reference 246) by the first flip-flop 12'(1) at the end of the shift mode time period;
- the LBIST controller 108 then causes the LBIST scan enable signal (LBIST_se) 112 to transition (reference 247) from the first logic state (i.e., logic high "1") to the second logic state (i.e., logic low "0") specifying the capture mode of operation for the flip-flop 12'(1);
- at this moment in time (reference 248), it will be noted that the LBIST scan enable signal (LBIST_se) 112 is logic low "0" and the data output (Q) and scan output (SO) of the flip-flop 12'(1) are both logic high "1" because the last shift value 246 of the test data is logic high "1", so that: a); the second LOS scan enable clock signal (LOS_se_clk2) 172 and second scan enable clock signal (se_clk2) 178 are both logic high "1"; and b) the flip-flops 12'(2)-12'(n) remain configured in shift mode while the flip-flop 12'(1) is configured in capture mode so as to support the pipeline scan enable LOS feature;
- with the next pulse (reference 249) of the second LBIST control clock signal (LBIST_ctl_clk2) 118 generated by the LBIST controller 108, referred to here as the first capture clock pulse, the last shift value of the test data is shifted to flip-flop 12'(2) and the logic low "0" value at the data input (D) of the flip-flip 12'(1) is passed through the flip-flop 12'(1) to the data output (Q) and scan output (SO) to drive the second LOS scan enable clock signal (LOS_se_clk2) 172 to logic low "0" (reference 250);
- the shifted in test data are applied to the combinatorial logic 16';
- with both the LBIST scan enable signal (LBIST_se) 112 and second LOS scan enable clock signal (LOS_se_clk2) 172 now at logic low "0", the second scan enable clock signal (se_clk2) 178 at the output of the second logic "OR" gate 174 is also logic low "0" (reference 252) and the flip-flops 12'(2)-12'(n) are thus also configured in the capture mode of operation;

at the next pulse (reference 254) of the second LBIST control clock signal (LBIST_ctl_clk2) 118 generated by the LBIST controller 108, referred to here as the second capture clock pulse, the flip-flops 12'(2)-12'(n) capture the test result data output from the combinatorial logic 16';

the LBIST controller 108 then causes the LBIST scan enable signal (LBIST_se) 112 to transition (reference 256) back to the first logic state (i.e., logic high "1") specifying the shift mode of operation for the flip-flop 12'(1) of the second scan chain 170;

the output of the second logic "OR" gate 174 thus also transitions to logic high "1" (reference 258) and the flip-flops 12'(2)-12'(n) of the second scan chain 170 are now also configured in the shift mode of operation; and with each pulse of the second LBIST control clock signal (LBIST_ctl_clk2) 118, the captured test data is shifted out (reference 260) from the second scan chain 170 and provided to the LBIST controller 108 using the second LBIST scan output data signal (LBIST_so2) 134.

Figure 6A:
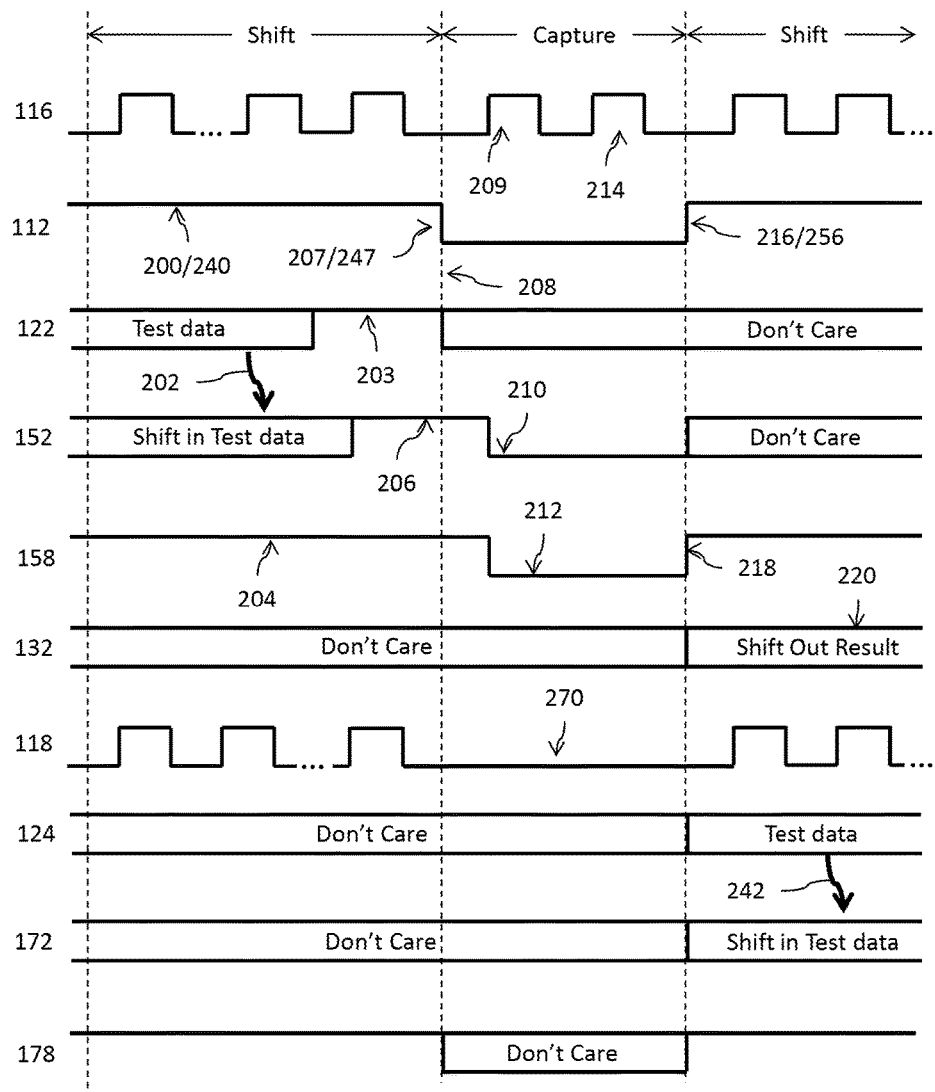
Figure 6B:
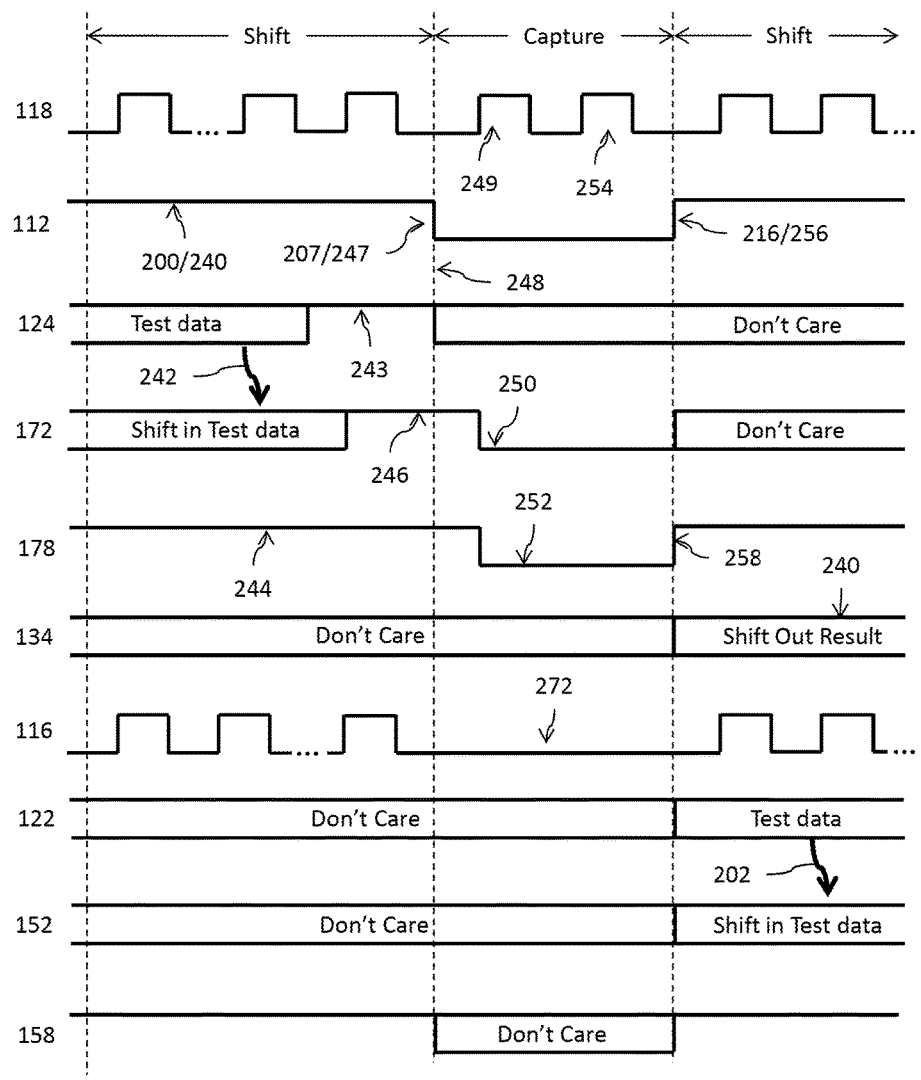

Reference is now made to FIGS. 6A and 6B showing the interleaved operation of the first and second scan chains 150 and 170, respectively. For at-speed testing of the partition relating to a given scan chain, the first and second capture clock pulses should only be generated with respect to the partition under test in the situation where the two clock domains (references 116 and 118) are asynchronous. FIG. 6A shows that when the first scan chain 150 is configured to support the pipeline scan enable LOS feature, the LBIST controller 108 controls the second LBIST control clock signal (LBIST_ctl_clk2) 118 so that no first and second capture clock pulses are generated (reference 270). Because no capture operation is performed with respect to the second scan chain 170, the logic states of the second LBIST scan input data signal (LBIST_si2) 124, second LOS scan enable clock signal (LOS_se_clk2) 172 and second scan enable clock signal (se_clk2) 178 are "don't care" conditions during at-speed transition testing of with the first scan chain 150. Likewise, FIG. 6B shows that when the second scan chain 170 is configured to support the pipeline scan enable LOS feature, the LBIST controller 108 controls the first LBIST control clock signal (LBIST_ctl_clk1) 116 so that no first and second capture clock pulses are generated (reference 272). Again, because no capture operation is performed with respect to the first scan chain 150, the logic states of the first LBIST scan input data signal (LBIST_si1) 122, first LOS scan enable clock signal (LOS_se_clk1) 152 and first scan enable clock signal (se_clk1) 158 are "don't care" conditions during at-speed transition testing with the second scan chain 170.

The interleaved operation of the scan chains further extends to the shift in of test data and the shift out of test result data. For example, FIG. 6A shows that while the first scan chain 150 is operating to shift out the test result data (reference 220), the second scan chain 170 is operating to shift in test data (reference 242). Conversely, FIG. 6B shows that while the second scan chain 170 is operating to shift out the test result data (reference 240), the first scan chain 150 is operating to shift in test data (reference 202).

FIG. 3 shows an example where the pipeline scan enable launch on shift (LOS) flip-flops 12(1) and 12'(1) are the first flip-flops in the scan chains 150 and 170, respectively. It will be understood, however, that the pipeline scan enable launch on shift (LOS) flip-flop need not be the first flip-flop. Rather, to enable a pipeline scan enable LOS feature, at least one pipeline scan enable launch on shift (LOS) flip-flop is needed per clock domain, with that flip-flop located anywhere within the scan chain such that the scan enable signal is applied to the scan enable (SE) input and logically OR'ed with the data (Q) output of the flip-flop to generate the scan enable clock signal applied to the scan enable (SE) inputs of the other flip-flops for the scan chain(s) of that same clock domain.

The following advantages accrue from the use of the pipeline scan enable LOS feature described herein: a) same amount of coverage is attained with a smaller pattern count; and b) for a same coverage requirement, less test points need to be inserted; c) since desired coverage can be obtained with a smaller pattern count, the total time required to execute the LBIST is reduced and the device enters functional mode more quickly.

Trial of the pipeline scan enable LOS feature (psLOS) described herein in comparison to a standard launch on capture (LOC) technique reveals the following:

| Mode | TPI? | Values forced at inputs | Pattern Count | Coverage | Comparison |
|------|------|-------------------------|---------------|----------|------------|
| LOC | No | C0 | 5000 | 52.37% | |
| psLOS | No | C0 | 5000 | 56.74% | 52.54% in 448 patterns |
| LOC | No | C1 | 5000 | 54.27% | |
| psLOS | No | C1 | 5000 | 57.63% | 54.45% in 960 patterns |
| LOC | Yes | C0 | 5000 | 59.89% | |
| psLOS | Yes | C0 | 5000 | 70.16% | 60.23% in 256 patterns |
| LOC | Yes | C1 | 5000 | 62.87% | |
| psLOS | Yes | C1 | 5000 | 67.74% | 62.92% in 640 patterns |

The table data refers to LBIST partition coverage obtained for a pattern count of 5000 with constant values "0" or "1" (referred to as C0 and C1, respectively) forced at the LBIST partition inputs. In some trials there is no test point insertion (TPI), while in other trials there is test point insertion. The table compares results for conventional launch on capture (LOC) operation against the pipeline scan enable LOS feature (psLOS) described herein.

The table data shows the advantages of using the pipeline scan enable LOS feature (psLOS). In particular, it will be noted that pipeline scan enable LOS feature (psLOS) is advantageous for at least the following reasons:

a) same amount of coverage with a smaller pattern count;

b) for a same coverage requirement, fewer test points are needed to be inserted. For example, if the coverage requirement is 80% and the table data indicates that LOC achieves 52% coverage and the pipeline scan enable LOS feature (psLOS) achieves 56% coverage, then fewer test points are needed in pipeline scan enable LOS feature (psLOS) to make up for the difference in coverage to reach the 80% requirement; and c) since desired coverage can be achieved with a smaller pattern count, the total time required to execute the LBIST is reduced and the device enters functional mode more quickly than with LOC.

In this comparison, the LOC technique differs from the pipeline scan enable LOS feature (psLOS) in that LOC does not utilize the flip-flops 12(1) and 12'(1) and does not utilize the logic OR gates 154 and 174.

Also, as understood in the art, test points are inserted when the required coverage cannot be obtained with LBIST pseudo-random patterns. The addition of test points serves to break the design at multiple points in order to provide for a higher degree of controllability and observability in order to reach the desired coverage with the LBIST pseudo-random patterns. The table data above shows that the pipeline scan enable LOS feature (psLOS) provides for a higher degree of coverage than LOC both when test points are not inserted and when a same number of test points are inserted.

The higher coverage provided for a same number of patterns using the pipeline scan enable LOS feature (psLOS) indicates the significance of using the pipeline scan enable LOS feature (psLOS) not only with respect to where LBIST stuck-at coverage is needed with at-speed patterns but also when LBIST transition coverage is needed with at-speed patterns.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a first flip-flop having a data input, a scan input, a data output and a scan output, said first flip-flop clocked by a clock signal and having a scan enable input configured to receive a first scan enable signal;
   a logic circuit having a first input coupled to the data output of the first flip-flop and a second input coupled to receive the first scan enable signal; and
   a second flip-flop having a data input, a scan input, a data output and a scan output, said scan input of the second flip-flop coupled to the scan output of the first flop-flop, said second flip-flop clocked by the clock signal and having a scan enable input configured to receive a second scan enable signal generated at an output of the logic circuit;
   wherein the first scan enable signal configures the first flip-flop to operate in a capture mode of operation while the second scan enable signal simultaneously configures the second flip-flop to operate in a shift mode of operation; and
   wherein a first capture pulse of the clock signal occurs while the first flip-flop is in the capture mode of operation and the second flip-flop is simultaneously in the shift mode of operation, said first flip-flop operating response to the first capture pulse to capture a data signal for output at the data output of the first flip-flop, said logic circuit responding to the output captured data signal by changing a logic state of the second scan enable to configure the second flip-flop to operate in the capture mode of operation.

2. The circuit of claim 1, wherein the logic circuit is a logic OR gate having a first input connected to the data output of the first flip-flop and a second input connected to receive the first scan enable signal and an output connected to the scan enable input of the second flip-flop.

3. The circuit of claim 1, further comprising a combinatorial logic circuit having an output coupled to the data input of the second flip-flop.

4. The circuit of claim 1, further comprising a combinatorial logic circuit having an input coupled to the data output of the second flip-flop.

5. The circuit of claim 1, wherein the data input of the first flip-flop is coupled to receive a fixed state logic signal.

6. The circuit of claim 1, wherein said scan input of the first flip-flop receives a test data signal.

7. The circuit of claim 1, wherein the first and second flip-flops operate in response to a second capture pulse of the clock signal immediately following the first capture pulse to capture data signals at the data inputs of the first and second flip-flops.

8. The circuit of claim 7, wherein the data signal at the data input of the first flip-flop is a fixed logic state data signal and wherein the data signal at the data input of the second flip-flop is output from a combinatorial logic circuit.

9. The circuit of claim 1, further comprising:
   a combinatorial logic circuit having an input coupled to the data output of the second flip-flop; and
   a third flip-flop having a data input, a scan input, a data output and a scan output, said data input of the third flip-flop coupled to an output of the combinatorial logic circuit, said scan input of the third flip-flop coupled to the scan output of the second flop-flop, said third flip-flop clocked by the clock signal and having a scan enable input configured to receive the second scan enable signal.

10. A circuit, comprising:
    a test control circuit configured to output a first clock signal, a second clock signal, a first scan enable signal, a first test data signal and a second test data signal;
    a first scan chain circuit, comprising:
       a first flip-flop having a data input, a scan input, a data output and a scan output, said first flip-flop clocked by the first clock signal and having a scan enable input configured to receive the first scan enable signal;
       a first logic circuit having a first input coupled to the data output of the first flip-flop and a second input coupled to receive the first scan enable signal; and
       a second flip-flop having a data input, a scan input, a data output and a scan output, said scan input of the second flip-flop coupled to the scan output of the first flop-flop, said second flip-flop clocked by the first clock signal and having a scan enable input configured to receive a second scan enable signal generated at an output of the first logic circuit; and
    a second scan chain circuit, comprising:
       a third flip-flop having a data input, a scan input, a data output and a scan output, said third flip-flop clocked by the second clock signal and having a scan enable input configured to receive the first scan enable signal;
       a second logic circuit having a first input coupled to the data output of the third flip-flop and a second input coupled to receive the first scan enable signal; and
       a fourth flip-flop having a data input, a scan input, a data output and a scan output, said scan input of the fourth flip-flop coupled to the scan output of the third flop-flop, said fourth flip-flop clocked by the second clock signal and having a scan enable input configured to receive a third scan enable signal generated at an output of the second logic circuit.

11. The circuit of claim 10, wherein the first and second clock signals are asynchronous.

12. The circuit of claim 10, wherein the first scan enable signal configures the first and third flip-flops to operate in a capture mode of operation while the second scan enable signal simultaneously configures the second flip-flop to operate in a shift mode of operation.

13. The circuit of claim 12, wherein the test control circuit generates a first capture pulse of the first clock signal while the first flip-flop is in the capture mode of operation and simultaneously inhibits generating a capture pulse of the second clock signal.

14. The circuit of claim 13, said first flip-flop operating response to the first capture pulse to capture a data signal for output at the data output of the first flip-flop, said first logic circuit responding to the output captured data signal by changing a logic state of the second scan enable to configure the second flip-flop to operate in the capture mode of operation.

15. The circuit of claim 14, wherein the first and second flip-flops operate in response to a second capture pulse of the first clock signal immediately following the first capture pulse to capture data signals at the data inputs of the first and second flip-flops.

16. The circuit of claim 15, wherein the data signal at the data input of the first flip-flop is a fixed logic state data signal and wherein the data signal at the data input of the second flip-flop is output from a combinatorial logic circuit.

* * * * *